United States Patent
Zimmer et al.

(10) Patent No.: US 8,147,927 B2
(45) Date of Patent: Apr. 3, 2012

(54) METHODS OF MAKING MULTILAYERED STRUCTURES

(75) Inventors: Jerry Wayne Zimmer, Saratoga, CA (US); Gerard James Chandler, Fremont, CA (US)

(73) Assignee: SP3, Inc., Santa Clara, CA (US)

( * ) Notice: Subject to any disclaimer, the term of this patent is extended or adjusted under 35 U.S.C. 154(b) by 0 days.

(21) Appl. No.: 13/068,616

(22) Filed: May 16, 2011

(65) Prior Publication Data

US 2011/0223321 A1 Sep. 15, 2011

Related U.S. Application Data

(62) Division of application No. 11/897,204, filed on Aug. 29, 2007, now Pat. No. 8,105,693.

(51) Int. Cl.
*C23C 16/00* (2006.01)
(52) U.S. Cl. ........................................ 427/577
(58) Field of Classification Search ............. 427/577
See application file for complete search history.

(56) References Cited

U.S. PATENT DOCUMENTS

| | | | |
|---|---|---|---|
| 4,783,368 A | 11/1988 | Yamamoto et al. |
| 5,244,712 A | 9/1993 | Eden |
| 5,472,787 A | 12/1995 | Johnson et al. |
| 5,500,248 A | 3/1996 | Iacovangelo et al. |
| 5,567,985 A | 10/1996 | Iacovangelo et al. |
| 5,645,937 A | 7/1997 | Noda et al. |
| 5,900,127 A | 5/1999 | Iida et al. |
| 6,306,270 B1 | 10/2001 | Hanni et al. |
| 6,531,226 B1 | 3/2003 | Petkie |
| 6,998,180 B2 | 2/2006 | Ludtke et al. |

FOREIGN PATENT DOCUMENTS

WO    WO 01/06967 A2    9/2001

OTHER PUBLICATIONS

Jaganndham, Multilayer Diamond Heat Spreaders for Electronic Power Devices, Solid-State Electronics vol. 42, No. 12, pp. 2199-2208, 1998.
Quagan, Diamond cools high-power emitters, LaserFocusWorld, pp. 1-6, 2005.

*Primary Examiner* — Archene Turner
(74) *Attorney, Agent, or Firm* — Robert Moll

(57) ABSTRACT

The present invention relates to a multilayered structure including at least one diamond layer and methods of making the multilayered structures. The multilayered structure includes a diamond layer having a top surface and a bottom surface, a first thin adhesion layer on the top surface, a second thin adhesion layer on the bottom surface, a first metal layer having a thermal conductivity greater than 200 W/m-K and a coefficient of thermal expansion greater than 12 ppm/K, wherein the first metal layer is deposited on the first thin adhesion layer, and a second metal layer having a thermal conductivity greater than 200 W/m-K and a coefficient of thermal expansion greater than 12 ppm/K, wherein the second metal layer is deposited on the second thin adhesion layer.

21 Claims, 7 Drawing Sheets

METHODS OF MAKING MULTILAYERED STRUCTURES

This application is a divisional of U.S. application Ser. No. 11/897,204, Multilayered Structures and Methods Thereof, filed on Aug. 29, 2007 now U.S. Pat. No. 8,105,693, which is incorporated by reference herein.

BACKGROUND

This invention relates to multilayered structures having one or more diamond layers and methods of making the multilayered structures.

An important problem in the electronics industry is how to dissipate the heat generated from a semiconductor device. The thermal energy must be sufficiently removed to avoid performance degradation or even failure. One mechanism involving heat transfer by conduction places a material referred to as a heat spreader adjacent to the semiconductor device. The rate of removal depends on the heat spreader's thermal conductivity and the thermal resistance of the bonding material between the semiconductor device and the heat spreader.

Diamond has desirable properties that should be useful in a heat spreader including high thermal conductivity, low electrical conductivity, high Young's modulus, wide bandwidth optical and EMR transmission, and extreme corrosion resistance.

Diamond's properties are difficult to exploit, however, because they do not match semiconductor devices' or metals' properties. For example, diamond's thermal conductivity is several times larger than copper or silver. Diamond's coefficient of thermal expansion is also substantially lower than that of many semiconductor devices. These differences also limit the bonding materials that can be used to avoid cracking or bending the semiconductor devices. Unfortunately, bonding materials that could be used have poor thermal conductivity and other problems such as electromigration and material creep effects. These problems limit the performance and reliability of the semiconductor device.

There exists a need for a structure that has a thermal conductivity which is similar to diamond and a coefficient of thermal expansion which can be matched to various semiconductor materials such as silicon, silicon carbide, gallium arsenide, and gallium nitride. Some products attempt to match the thermal expansion using copper layers bonded to both sides aluminum nitride or beryllium oxide. However, they have thermal conductivities which are typically no higher than their ceramic layer. Further, they must have thick layers of copper to attempt to match the expansion which limits the ability for patterned and electrically isolated regions on mounting surfaces.

SUMMARY OF INVENTION

The present invention relates to a multilayered structure having one or more diamond layers and methods of making the multilayered structures.

In an embodiment, the multilayered structure includes a diamond layer having a top surface and a bottom surface, a first adhesion layer on the top surface, a second adhesion layer on the bottom surface, a first metal layer having a thermal conductivity greater than 200 W/m-K and a coefficient of thermal expansion greater than 12 ppm/K, wherein the first metal layer is deposited on the first adhesion layer, and a second metal layer having a thermal conductivity greater than 200 W/m-K and a coefficient of thermal expansion greater than 12 ppm/K, wherein the second metal layer is deposited on the second adhesion layer.

In another embodiment, the invention relates to a method of making a multilayered structure including growing a diamond layer on a substrate, applying a first adhesion layer to the diamond layer, applying a first metal layer on the first adhesion layer, removing the substrate, applying a second adhesion layer to the diamond layer, and applying a second metal layer on the second adhesion layer such that the first and second metal layers are the outer layers of the multilayered structure.

DETAILED DESCRIPTION OF PREFERRED EMBODIMENTS

The following description includes the best mode of carrying out the invention, illustrates the principles of the invention, uses illustrative values, and should not be taken in a limiting sense. The scope of the invention is determined by reference to the claims. Each part or step is assigned its own number in the specification and drawings. The drawings are not to scale and do not reflect the relative thickness of any of the layers.

The invention provides a multilayered structure that has the desired thermal conductivity and coefficient of thermal expansion and the ability for finer patterning and electrical isolation of the outer metal layers. One aspect of the invention therefore is to reduce the thickness of the diamond which also reduces the required thickness of the metal layer(s). This aspect could be embodied in a multilayered structure including a high CTE metal layer such as a copper layer, a diamond layer, and another high CTE metal layer as shown in FIG. 1A.

Figure 1A:
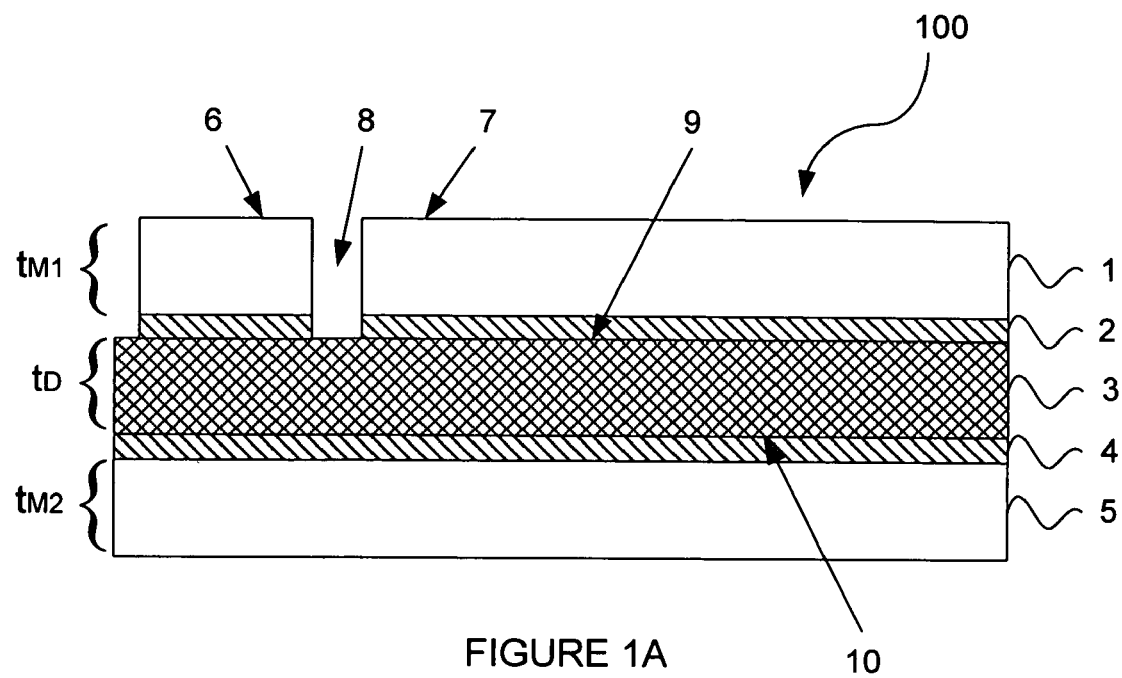
FIG. 1A is a cross-sectional view of an embodiment of a multilayered structure that has one diamond layer.

FIG. 1A illustrates a cross-sectional view of an embodiment of a multilayered structure 100 that has a diamond layer 3. As shown, the diamond layer 3 has a top surface 9 and a bottom surface 10. A first thin adhesion layer 2 is disposed on the top surface 9 and a second thin adhesion layer 4 is on the bottom surface 10. A first metal layer 1 having a thermal conductivity greater than 200 W/m-K and a coefficient of thermal expansion greater than 12 ppm/K where the first metal layer 1 is deposited on the first thin adhesion layer 2. A second metal layer 5 having a thermal conductivity greater than 200 W/m-K and a coefficient of thermal expansion greater than 12 ppm/K is deposited on the second thin adhesion layer 4.

Figure 1B:
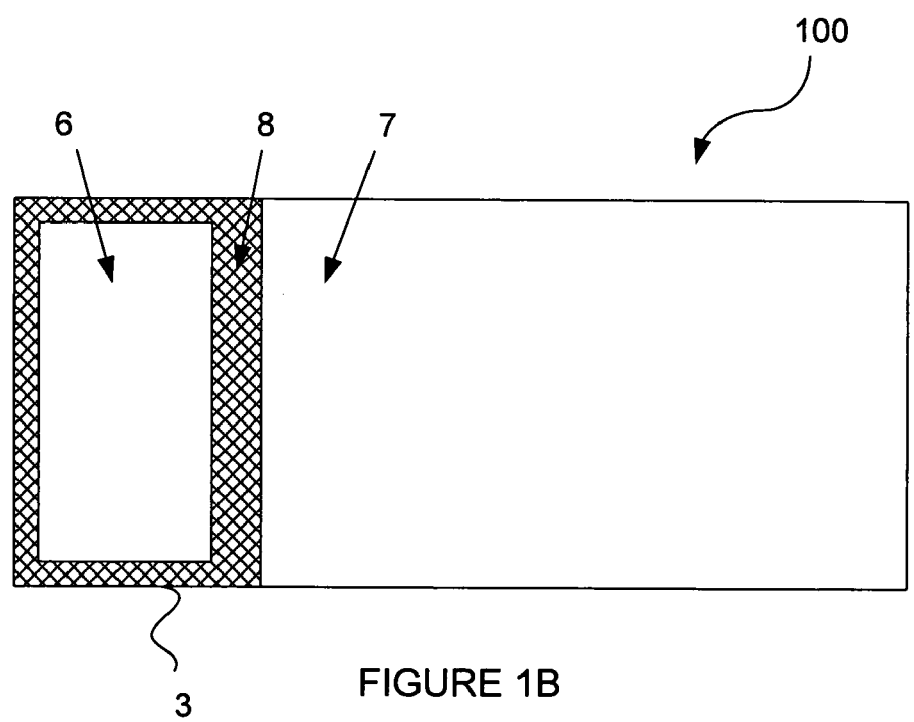
FIG. 1B is a top view of the multilayered structure of FIG. 1A.

FIG. 1B is a top view of the multilayered structure 100 of FIG. 1A. The first metal layer 1 and the first thin adhesion layer 2 can be patterned using standard semiconductor processes such as photolithography into one or more electrically isolated regions. As shown, the first metal layer 1 and the first thin adhesion layer 2 are patterned into two electrically isolated regions 6 and 7 which form a gap 8 and expose the diamond layer 3.

The following CTE matching equation (1) can be used to determine the thickness of the diamond layer in the multilayered structure illustrated in FIG. 1A:

$$t_D = t_{M1} \times (E_D/E_{M1}) \times ((CTE_{M1} - CTE_C)/(CTE_C - CTE_D)) + t_{M2} \times (E_D/E_{M2}) \times ((CTE_{M2} - CTE_C)/(CTE_C - CTE_D)),$$

where the variables:
$t_D$ = thickness of the diamond layer
$t_{M1}$ = thickness of the first metal layer
$t_{M2}$ = thickness of the second metal layer
$E_D$ = Young's modulus of the diamond layer
$E_{M1}$ = Young's modulus of the first metal layer
$E_{M2}$ = Young's modulus of the second metal layer
$CTE_D$ = coefficient of thermal expansion of the diamond layer
$CTE_{M1}$ = coefficient of thermal expansion of the first metal layer
$CTE_{M2}$ = coefficient of thermal expansion of the second metal layer
$CTE_C$ = coefficient of thermal expansion of the surface of the multilayered structure.

The CTE matching equation (1) can be executed in PC software such as Microsoft Excel Solver to determine the thickness of the metal and diamond layers as long as thin adhesion layers are used. For example, each adhesion layer is preferably relatively thin (less than 10%) compared to the thickness of each of the outer metal layers. A thin adhesion layer may be between 10-1000 nanometers, and preferably between 50-500 nanometers. Also see example 1 below.

Figure 2:
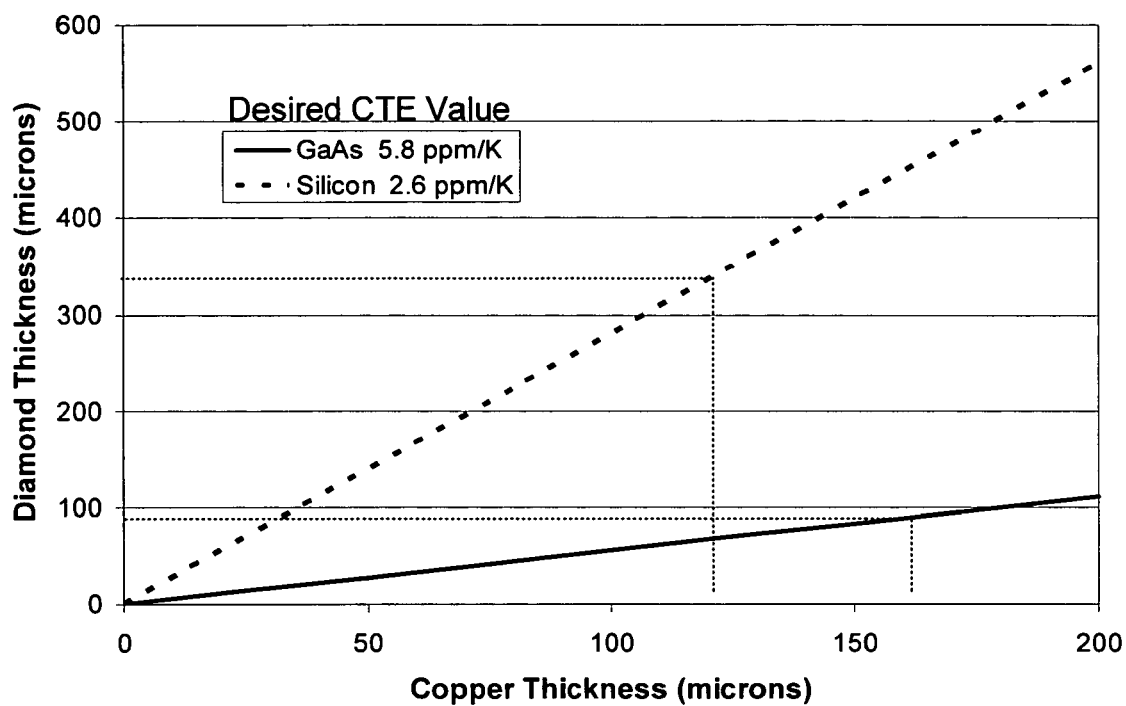
FIG. 2 is a graph of the relative thickness of diamond and copper to use in a multilayered structure to match GaAs and silicon's coefficients of thermal expansion.

FIG. 2 is a graph that could be obtained by inserting physical properties of the layers (e.g., Young's modulus) into the CTE matching equation (1). Referring to FIG. 2, we can see the relative thickness of diamond and copper to use in a multilayered structure when the metal layers have the same thickness. The solid line plots the relative thickness for a GaAs device while the dotted line plots the relative thickness for a silicon device. For example, a 340 micron diamond layer requires a 120 micron copper layer for a silicon device. In another example, a 90 micron diamond layer requires a 160 micron copper layer for a GaAs device. This type of graph could be also constructed for other metal layers.

Figure 3A:
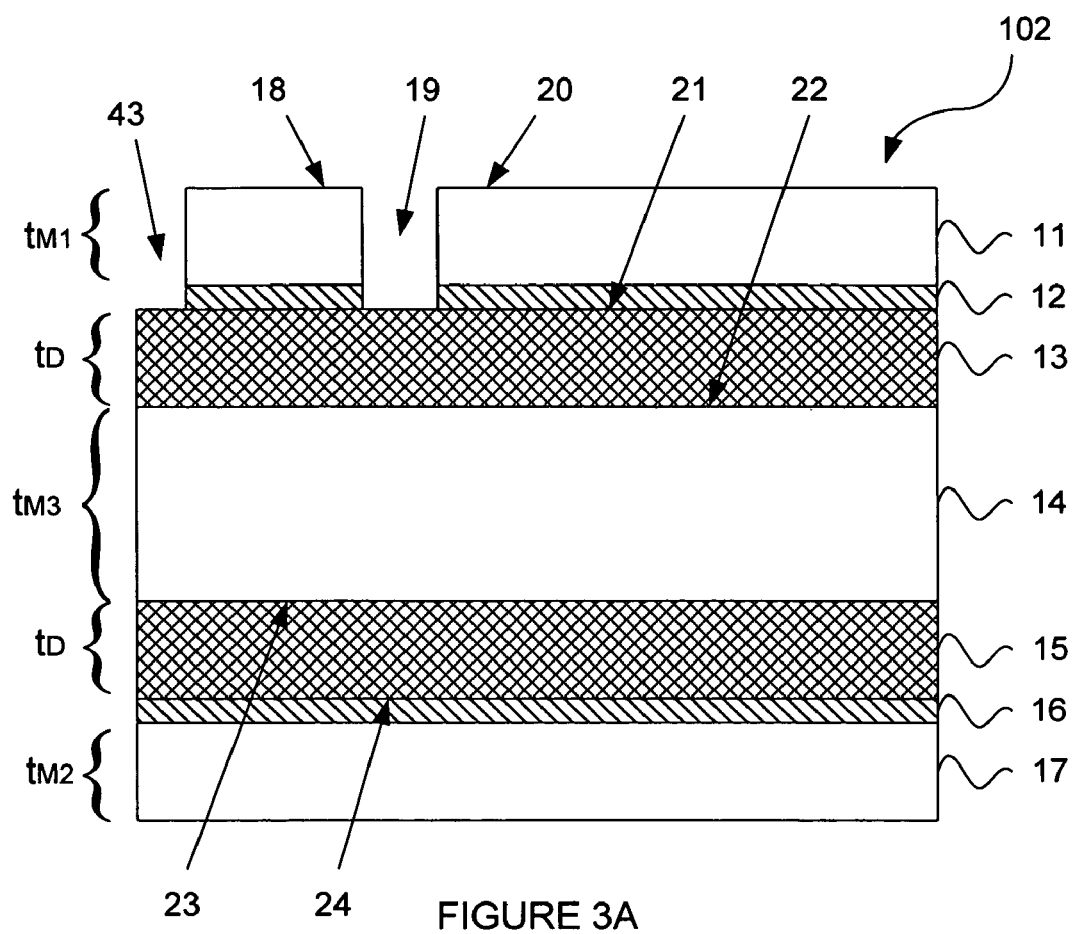
FIG. 3A is a cross-sectional view of an embodiment of the multilayered structure that has an inner metal layer between two diamond layers.

FIG. 3A illustrates a cross-sectional view of an embodiment of a multilayered structure 102 that has two diamond layers. As shown, the multilayered structure 102 includes an inner metal layer 14 having a thermal conductivity greater than 200 W/m-K and a coefficient of thermal expansion greater than 12 ppm/K. The first diamond layer 13 is bonded to the top surface 22 of the inner metal layer 14 and the second diamond layer 15 is bonded to the bottom surface 23 of the inner metal layer 14. In this application, we note that one of ordinary skill can bond a diamond layer to a metal layer using various semiconductor and/or brazing processes and what process is used is not essential to the invention. Example 2 (see page 14 below) describes one known process of vacuum brazing to bond the diamond layer to the metal layer. A first thin adhesion layer 12 is deposited on the top surface 21 of the first diamond layer 13 and a second thin adhesion layer 16 is deposited on the bottom surface 24 of the second diamond layer 15. A first outer metal layer 11 having a thermal conductivity greater than 200 W/m-K and a coefficient of thermal expansion greater than 12 ppm/K is deposited on the first thin adhesion layer 12 and a second outer metal layer 17 having a thermal conductivity greater than 200 W/m-K and a coefficient of thermal expansion greater than 12 ppm/K is deposited on the second thin adhesion layer 16.

Figure 3B:
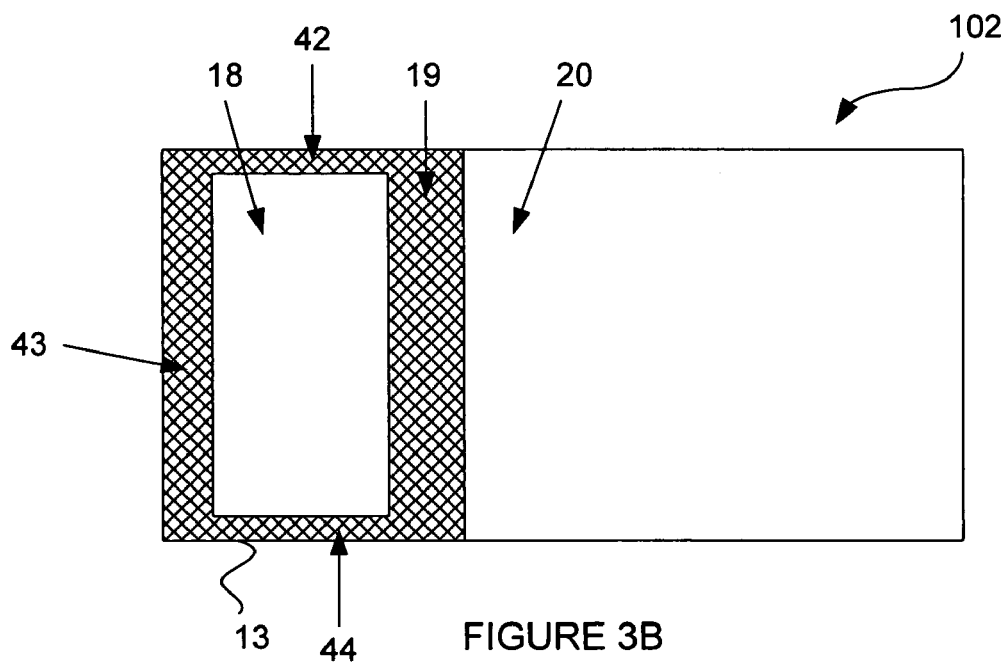
FIG. 3B is a top view of the multilayered structure of FIG. 3A.

FIG. 3B is a top view of the multilayered structure 102 of FIG. 3A. The first outer metal layer 11 and the first thin adhesion layer 12 can be patterned using standard semiconductor processes such as photolithography into one or more electrically isolated regions. As shown, the first outer metal layer 11 and the first thin adhesion layer 12 are patterned into two electrically isolated regions 18 and 20 forming a gap 19 and spaces 42, 43, and 44, which expose the diamond layer 13.

Figure 4:
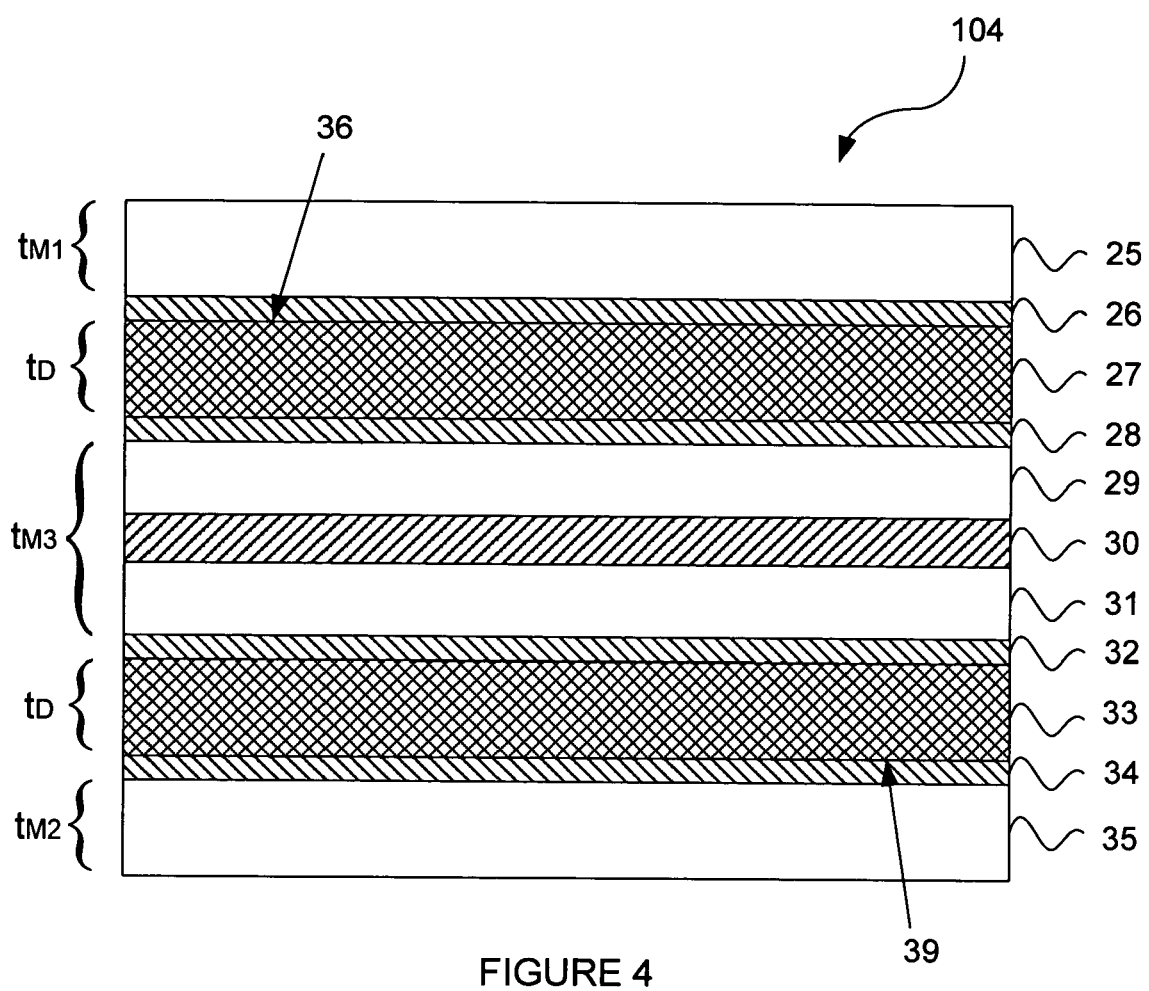
FIG. 4 is a cross-sectional view of the embodiment similar to that shown in FIG. 3A where the inner metal layer is composed of multiple inner metal layers.

FIG. 4 illustrates a cross-sectional view of an embodiment of a multilayered structure 104 that has a plurality of inner metal layers. As shown, the multilayered structure 104 includes a first inner metal layer 29 having a thermal conductivity greater than 200 W/m-K and a coefficient of thermal expansion greater than 12 ppm/K and a second inner metal layer 31 having a thermal conductivity greater than 200 W/m-K and a coefficient of thermal expansion greater than 12 ppm/K. A brazing alloy or solder alloy 30 having a thermal conductivity greater than 50 W/m-K and a coefficient of thermal expansion greater than 12 ppm/K is disposed between the first inner metal layer 29 and the second inner metal layer 31. A first inner thin adhesion layer 28 is disposed between a first diamond layer 27 and the first inner metal layer 29. A second inner thin adhesion layer 32 is disposed between a second diamond layer 33 and the second inner metal layer 31. A first outer thin adhesion layer 26 is deposited on the top surface 36 of the first diamond layer 27. A second outer thin adhesion layer 34 is deposited on the bottom surface 39 of the second diamond layer 33. A first outer metal layer 25 having a thermal conductivity greater than 200 W/m-K and a coefficient of thermal expansion greater than 12 ppm/K is deposited on the first outer thin adhesion layer 26 and a second outer metal layer 35 having a thermal conductivity greater than 200 W/m-K and a coefficient of thermal expansion greater than 12 ppm/K is deposited on the second outer thin adhesion layer 34.

The following CTE matching equation (2) can determine the thickness of the first and second diamond layers for the embodiments illustrated in FIG. 3A through FIG. 4:

$$t_D = t_{M1} \times (E_D/E_{M1}) \times ((CTE_{M1} - CTE_C)/(CTE_C - CTE_D)) + t_{M2} \times (E_D/E_{M2}) \times ((CTE_{M2} - CTE_C)/(CTE_C - CTE_D)),$$

where the variables:
$t_D$ = thickness of each of the first and second diamond layers
$t_{M1}$ = thickness of the first outer metal layer
$t_{M2}$ = thickness of the second outer metal layer
$E_D$ = Young's modulus of the first and second diamond layers
$E_{M1}$ = Young's modulus of the first outer metal layer
$E_{M2}$ = Young's modulus of the second outer metal layer
$CTE_D$ = coefficient of thermal expansion of each of the first and second diamond layers
$CTE_{M1}$ = coefficient of thermal expansion of the first outer metal layer
$CTE_{M2}$ = coefficient of thermal expansion of the second outer metal layer CTE$_C$=coefficient of thermal expansion for surface of the multilayered structure The thickness of the inner metal layer can be determined by the following equation $$t_{M3}=t_{M1}+t_{M2}$$

As long as CTE$_{M3}$=coefficient of thermal expansion of the inner metal layer=average value of CTE$_{M1}$ and CTE$_{M2}$ and E$_{M3}$=Young's modulus of the inner metal layer=the average value of E$_{M1}$ and E$_{M2}$ and each adhesion layer is relatively thin (less than 10%) compared to the thickness of each of the outer metal layers, the CTE matching equation (2) can determine the thickness of the diamond layers and the metal layers again using PC software such as Microsoft Excel Solver.

The thickness of each outer metal layer is determined by the thickness of the adjacent diamond layer and the properties of the diamond and metal layers such as Young's modulus and the CTE difference between the metal and diamond layers. The thickness of the inner metal layer is equal or greater than the sum of the two outer metal layers multiplied by the ratio of the CTE between the inner and outer metal layers. This multilayered structure provides a symmetrical expansion characteristic which will be compatible with semiconductors and allow a high thermal conductivity and a high reliability bond between the semiconductor device and the multilayered structure.

A multilayered structure can maintain symmetry and follow the CTE matching equation (2) with an inner metal layer that is not the same thickness as the sum of the outer metal layers as long as the thicknesses of the diamond layers are the same and the outer metal layers and the diamond layers form symmetrical structures.

Figure 5:
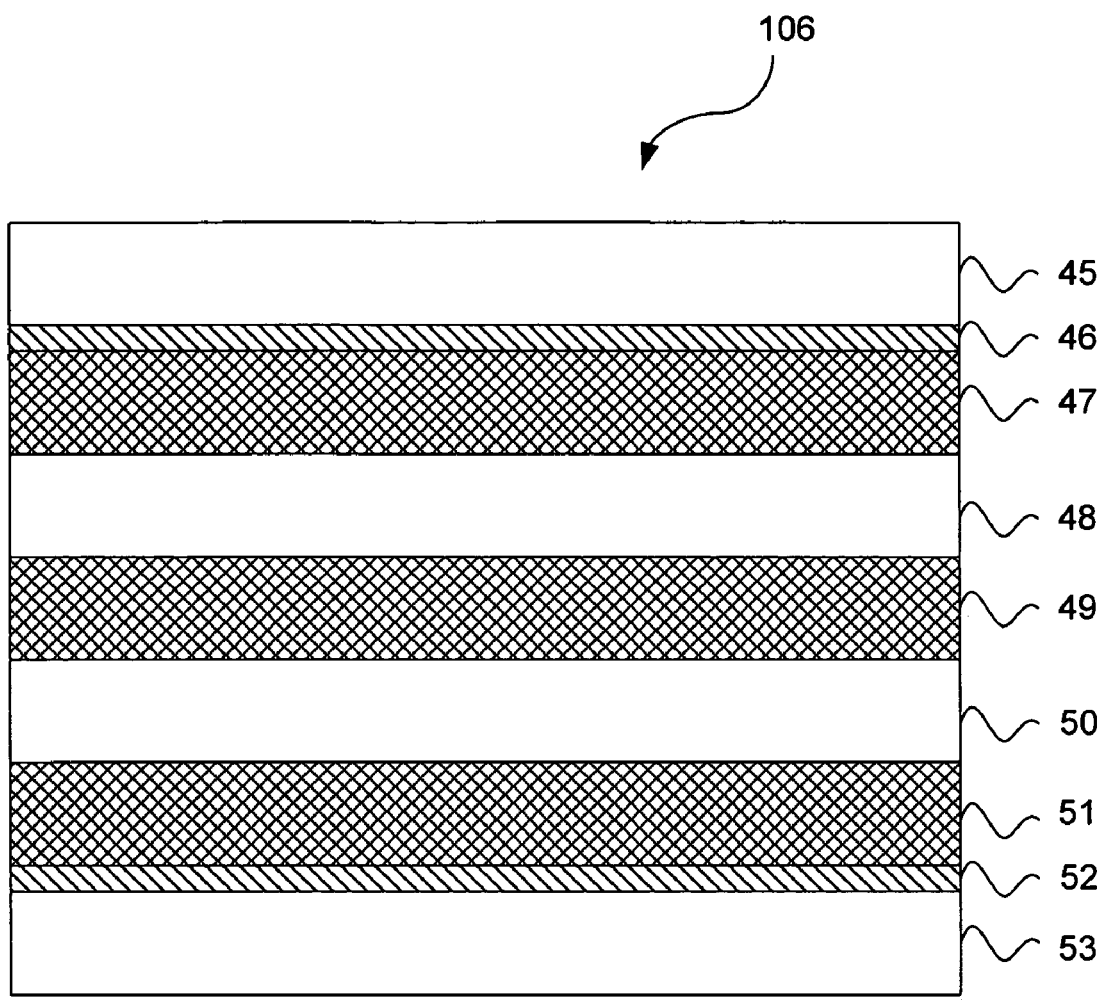
FIG. 5 is a cross-sectional view of a multilayered structure that has more than two diamond layers.

FIG. 5 illustrates a cross-sectional view of another embodiment of a multilayered structure 106 that has more than two diamond layers. The multilayered structure 106 includes a first inner metal layer 48 having a thermal conductivity greater than 200 W/m-K and a coefficient of thermal expansion greater than 12 ppm/K, a first diamond layer 47 bonded to the top surface of the first inner metal layer 48. The multilayered structure 106 also includes a second diamond layer 49 bonded to the bottom surface of the first inner metal layer 48. A second inner metal layer 50 having a thermal conductivity greater than 200 W/m-K and a coefficient of thermal expansion greater than 12 ppm/K is bonded to the bottom surface of the second diamond layer 49. A third diamond layer 51 is bonded to the bottom surface of the second inner metal layer 50. A first thin adhesion layer 46 is on the top surface of the first diamond layer 47. A second thin adhesion layer 52 is on the bottom surface of the third diamond layer 51. A first outer metal layer 45 having a thermal conductivity greater than 200 W/m-K and a coefficient of thermal expansion greater than 12 ppm/K is deposited on the first thin adhesion layer 46. A second outer metal layer 53 having a thermal conductivity greater than 200 W/m-K and a coefficient of thermal expansion greater than 12 ppm/K is deposited on the second thin adhesion layer 52.

Figure 6:
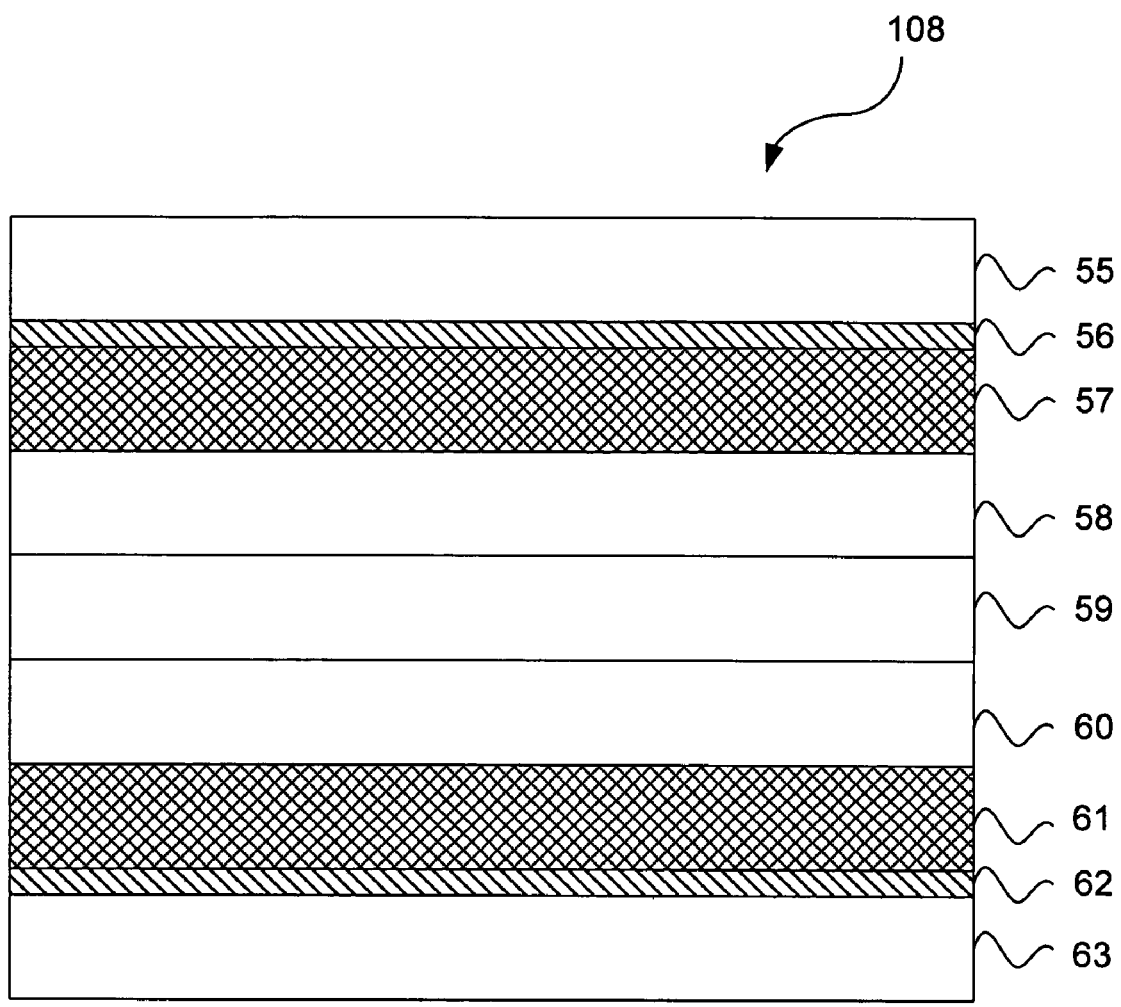
FIG. 6 is a cross-sectional view of a thicker multilayered structure that has multiple inner metal layers.

FIG. 6 illustrates a cross-sectional view of an embodiment of a thicker multilayered structure 108 that has multiple inner metal layers. The multilayered structure 108 includes a first inner metal layer 58 having a thermal conductivity greater than 200 W/m-K and a coefficient of thermal expansion greater than 12 ppm/K. A first diamond layer 57 is bonded to the top surface of the first inner metal layer 58. A second inner metal layer 59 having a thermal conductivity greater than 200 W/m-K and a coefficient of thermal expansion greater than 12 ppm/K is bonded to the bottom surface of the first inner metal layer 58. A third inner metal layer 60 having a thermal conductivity greater than 200 W/m-K and a coefficient of thermal expansion greater than 12 ppm/K is bonded to the bottom surface of the second inner metal layer 59. A second diamond layer 61 is bonded to the bottom surface of the third inner metal layer 60. A first thin adhesion layer 56 is on the top surface of the first diamond layer 57. A second thin adhesion layer 62 is on the bottom surface of the second diamond layer 61. A first outer metal layer 55 having a thermal conductivity greater than 200 W/m-K and a coefficient of thermal expansion greater than 12 ppm/K is deposited on the first thin adhesion layer 56. A second outer metal layer 63 having a thermal conductivity greater than 200 W/m-K and a coefficient of thermal expansion greater than 12 ppm/K is deposited on the second thin adhesion layer 62.

Figure 7:
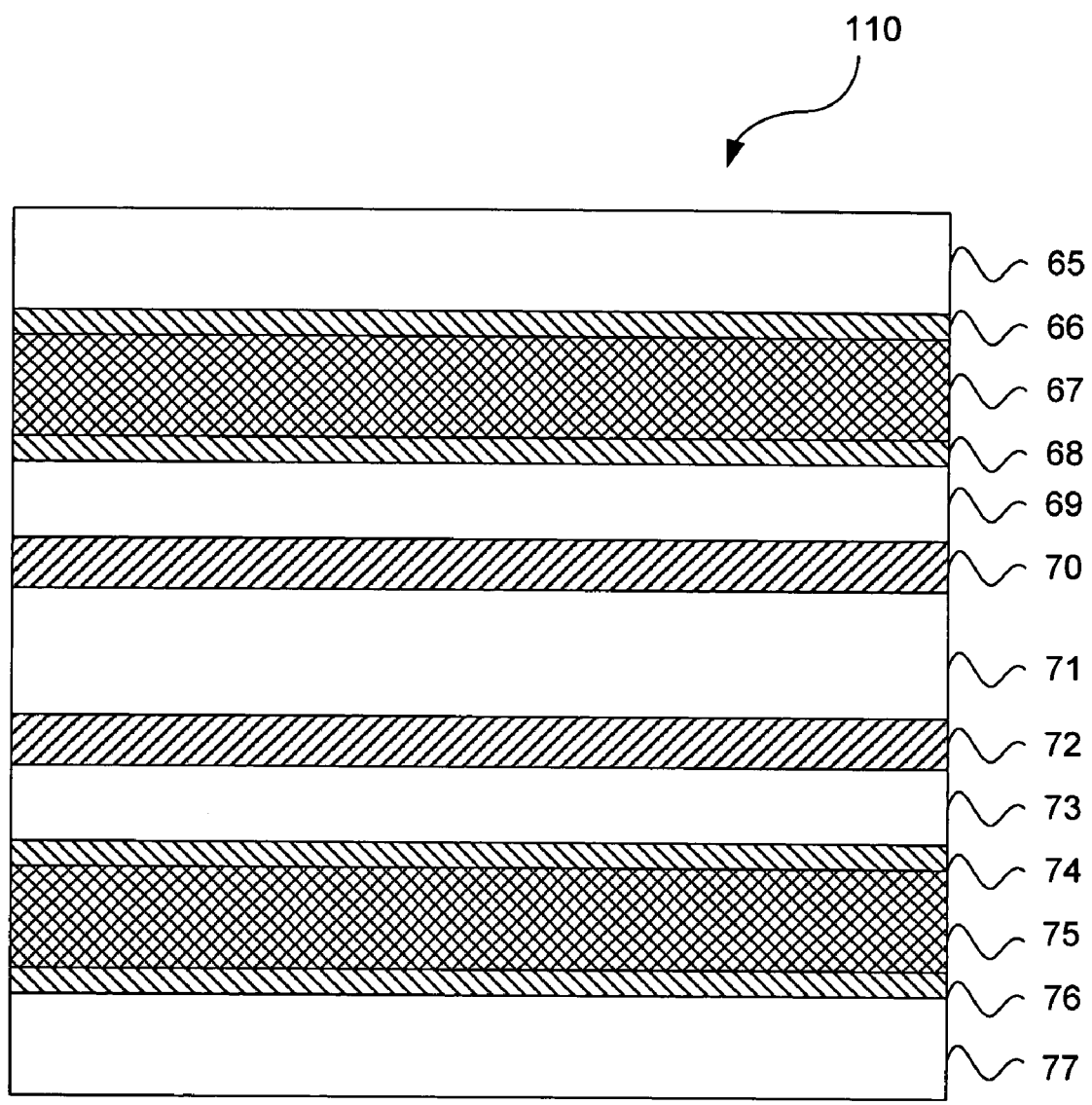
FIG. 7 is a cross-sectional view of a multilayered structure made of two structures as shown in FIG. 1 bonded together using metal alloys.

FIG. 7 is a cross-sectional view of a multilayered structure 110 made of two structures as shown in FIG. 1 bonded together using metal alloys. The multilayered structure 110 includes a first inner metal layer 69 having a thermal conductivity greater than 200 W/m-K and a coefficient of thermal expansion greater than 12 ppm/K and a second inner metal layer 71 having a thermal conductivity greater than 200 W/m-K and a coefficient of thermal expansion greater than 12 ppm/K. A first metal alloy 70 such as braze or a solder having a thermal conductivity greater than 50 W/m-K and a coefficient of thermal expansion greater than 12 ppm/K bonds the first inner metal layer 69 and second inner metal layer 71. The multilayered structure also includes a third inner metal layer 73 having a thermal conductivity greater than 200 W/m-K and a coefficient of thermal expansion greater than 12 ppm/K. A second metal alloy 72 such as braze or solder having a thermal conductivity greater than 50 W/m-K and a coefficient of thermal expansion greater than 12 ppm/K bonds the second inner metal layer 71 and the third inner metal layer 73. The multilayered structure also includes a first diamond layer 67 and a first inner thin adhesion layer 68 between the first diamond layer 67 and the first inner metal layer 69. The multilayered structure also includes a second diamond layer 75 and a second inner thin adhesion layer 74 between the second diamond layer 75 and the third inner metal layer 73. A first outer thin adhesion layer 66 is on the top surface of the first diamond layer 67 and a second outer thin adhesion layer 76 is on the bottom surface of the second diamond layer 75. A first outer metal layer 65 having a thermal conductivity greater than 200 W/m-K and a coefficient of thermal expansion greater than 12 ppm/K is deposited on the first outer thin adhesion layer 66. A second outer metal layer 77 having a thermal conductivity greater than 200 W/m-K and a coefficient of thermal expansion greater than 12 ppm/K, wherein the second outer metal layer 77 is deposited on the second outer thin adhesion layer 76.

The following examples 1-8 describe further details on how to make the multilayered structures illustrated in FIG. 1 and FIG. 3A-FIG. 7. For conciseness, we incorporate by reference herein U.S. Pat. No. 5,833,753 to Herlinger et al., Reactor Having an Array of Heating Filaments and a Filament Force Regulator that describes a suitable reactor for growing chemical vapor deposition (CVD) diamond and U.S. Pat. No. 6,319,610 B1 to Zimmer, Graded Grain Size Diamond Layer that describes suitable methods of depositing CVD diamond layers. We also incorporate by reference herein Nishi and Doering, *Handbook of Semiconductor Manufacturing Technology* (2000) for known semiconductor processes, techniques, and equipment that can be used to make the multilayered structures of the application.

Example 1

The embodiment of the multilayered structure illustrated in FIGS. 1A-1B can be made by growing CVD diamond layer 3 on a silicon wafer (not shown) using hot filament or any similar diamond deposition technology.

The resulting diamond coated silicon wafer can be coated using conventional sputtering or other physical vapor deposition (PVD) technology on the diamond side with a thin adhesion layer 4 such as NiCr, TiW, or Cr followed by a seed layer of copper (Cu). The seed layer can be then plated with Cu, Ag, or a combination to form the metal layer 5 to a desired thickness using the CTE matching equation (1) to match a semiconductor device or an electronic component (not shown) to be mounted on the metal layer 1. The silicon wafer is removed by grinding, polishing, and or etching techniques.

The resulting structure of the diamond layer 3, the thin adhesion layer 4, and the metal layer 5 can be coated on the diamond side with the thin adhesion layer 2 such as NiCr, TiW, or Cr followed by a seed layer of copper (Cu) using sputtering or other physical vapor deposition (PVD) technology. The seed layer can be then plated with Cu, Ag, or a combination to form the metal layer 1 to a desired thickness using the CTE matching equation (1) so as to match an electronic component to be mounted on it.

The first metal layer 1 and second metal layer 5 can be further plated with Ni, Au, Pd, Pt or any other metals which are compatible with standard device attachment solders such as AuSn. In addition, the AuSn solder layer can also be applied at this time either by plating or PVD techniques.

After the further plating the multilayered structure can be divided into smaller pieces (i.e., segmenting) using laser and/or etching techniques to create individual multilayered structures which are electrically isolated between the two outer conductive surfaces by the intervening electrically insulating diamond layers.

The method of making the multilayered structure can optionally include a photomasking step to make electrically isolated metallized areas 6 and 7 as shown in FIG. 1B. The photomasking step can be implemented either before or after the plating step used to make metal layer 1. If before the plating step, the photomask prevents plating in space 8 shown in FIGS. 1A-1B. If after the plating step, the photomask protects electrically isolated metallized areas 6 and 7 during an etch step that removes metal layer 1 in isolation space 8. In either case an etching step is used to remove the thin adhesion layer 2 after metal layer 1 has been patterned. Additionally, a second photomasking step can be used to protect either area 6 or 7 for selective deposition of additional metal layers. For example, the area 6 can be masked and an AuSn solder and/or barrier metal layers deposited on the area 7.

Example 2

The embodiment of the multilayered structure illustrated in FIGS. 3A-3B can be made by growing CVD diamond as described in Example 1. In this embodiment, the diamond layer 13 is grown on a silicon wafer (not shown) and the diamond layer 15 is grown on another silicon wafer (not shown). The silicon wafers can be then attached to each other by vacuum brazing the two diamond layers 13 and 15 together using inner metal layer 14 such as a braze foil consisting of Cu, Ag, and a reactive carbide forming component such as titanium or zirconium. An example of the braze foil is a reactive braze such as Wesgo CuSil ABA made by Wesgo, Hayward, Calif. During the vacuum brazing, a weight can be placed on the silicon wafers to apply a pressure (e.g., 1-2 psi) to ensure the diamond coated surfaces of the silicon wafers contact the braze at the melting point of the braze (e.g., 800-900 C). Grinding, polishing, and or etching techniques then remove the silicon wafers. As a result, the diamond layer 13, the inner metal layer 14, and the diamond layer 15 form a free standing substrate.

Next, a first thin adhesion layer 12 coats the diamond layer 13 and a second thin adhesion layer 16 coats diamond layer 15. The thin adhesion layers 12 and 16 can be NiCr, TiW, or Cr followed by a seed layer of copper (Cu) as described in Example 1. After coating, the seed layers can be plated to form the outer metal layers 11 and 17 as described in Example 1 with Cu, Ag, or a combination to the desired thickness using CTE matching equation (2). Additional plating, patterning, and segmenting can be implemented as described in Example 1.

Example 3

The embodiment of the multilayered structure illustrated in FIG. 4 is made by bonding two structures made according to the techniques of Example 1. In FIG. 4, layer 30 bonds the two structures (e.g., layers 25-29 and 31-35). The layer 30 can be a braze alloy as described in Example 2 or a suitable solder alloy such as AuSn. The soldering can be done by applying pressure (e.g., 1-2 psi) to the two structures and heating to a temperature (e.g., 300 C) above the melting point of the AuSn solder for a time sufficient to bond and diffusing the solder into the two structures so that the melting point of the solder is raised above the initial melting point. Additional plating, patterning, and segmenting can be implemented as described in Example 1.

Example 4

The embodiment of the multilayered structure illustrated in FIG. 5 can be made by growing CVD diamond layers as described in Example 1. In this embodiment, the diamond layer 47, 49, and 51 are each grown on a silicon wafer (not shown). Two silicon wafers can be then attached to each other by vacuum brazing diamond layers 47 and 49 together using a first inner metal layer 48 such as a braze foil consisting of Cu, Ag, and a reactive carbide forming component such as titanium or zirconium. During the vacuum brazing, a weight can be placed on the silicon wafers to apply a pressure (e.g., 1-2 psi) to ensure the diamond coated surfaces of the silicon wafers contact the braze at the melting point of the braze (e.g., 800-900 C). Grinding, polishing, and or etching techniques then remove the silicon wafers. As a result, the diamond layer 47, the first inner metal layer 48, and the diamond layer 49 form a free standing substrate. A second inner metal layer 50 bonds the resulting free standing substrate (layers 47-49) to the diamond layer 51 using the brazing technique described above.

Next, a first thin adhesion layer 46 coats the diamond layer 47 and a second thin adhesion layer 52 coats diamond layer 51. The thin adhesion layers 46 and 52 can be NiCr, TiW, or Cr followed by a seed layer of copper (Cu) as described in Example 1. After coating, the seed layer can be plated to form the outer metal layers 45 and 53 as described in Example 1 with Cu, Ag, or a combination to the desired thickness using CTE matching equation (2). Additional plating, patterning, and segmenting can be implemented as described in Example 1.

Example 5

The embodiment of the multilayered structure illustrated in FIG. 6 can be made by growing CVD diamond layers as described in Example 1. In this embodiment, the diamond layer 57 and 61 are each grown on a silicon wafer (not shown). The two silicon wafers can be then attached to each other by vacuum brazing diamond layers 57 and 61 together using a first inner metal layer 58, such as a braze foil consisting of Cu, Ag, and a reactive carbide forming component such as titanium or zirconium, a second inner metal layer 59 such as copper foil, and an third inner metal layer 60, such as a braze foil consisting of Cu, Ag, and a reactive carbide forming component such as titanium or zirconium. The three inner metal layers permit a thicker and more rigid structure because the diamond layers are spaced further apart.

During the vacuum brazing, a weight can be placed on the silicon wafers to apply a pressure (e.g., 1-2 psi) to ensure the diamond coated surfaces of the silicon wafers and the second inner metal layer contact the braze at the melting point of the braze (e.g., 800-900 C). Grinding, polishing, and or etching techniques then remove the silicon wafers. As a result, the layers 57-61 form a free standing substrate.

Next, a first thin adhesion layer 56 coats the diamond layer 57 and a second thin adhesion layer 62 coats the diamond layer 61. The thin adhesion layers 56 and 62 can be NiCr, TiW, or Cr followed by a seed layer of copper (Cu) as described in Example 1. After coating, it can be plated to form the outer metal layers 55 and 63 as described in Example 1 with Cu, Ag, or a combination to the desired thickness using CTE matching equation (2). Additional plating, patterning, and segmenting can be implemented as described in Example 1.

Example 6

The embodiment of the multilayered structure illustrated in FIG. 7 is made by bonding two structures made according to the techniques of Example 1. In FIG. 7, layers 70-72 bond the two structures (e.g., layers 65-69 and 73-77). The metal alloy layers 70 and 72 can be a braze alloy or a solder alloy such as AuSn. A second inner metal layer 71 such as copper foil is between metal alloys 70 and 72. If brazing, one can use the techniques of Example 2. If soldering, one can use the techniques of Example 3. Additional plating, patterning, and segmenting can be implemented as described earlier in Example 1.

Example 7

Other embodiments of the multilayered structure can be achieved by substituting PVD deposition (e.g., sputtering, evaporation, or cathodic arc) for the plating steps.

Example 8

Other embodiments of the multilayered structure can be made by growing CVD diamond doped with boron or some other suitable p-type dopant to make the diamond electrically conductive. This permits a CTE matched multilayered structure which is electrically conductive between the outer layers.

What is claimed:

1. A method of making a multilayered structure, comprising:
   growing a diamond layer on a substrate, wherein the bottom surface of the diamond rests on the substrate;
   applying a first thin adhesion layer on the top surface of the diamond layer;
   applying a first metal layer having a thermal conductivity greater than 200 W/m-K and a coefficient of thermal expansion greater than 12 ppm/K on the first thin adhesion layer;
   removing the substrate;
   applying a second thin adhesion layer on the bottom surface of the diamond layer; and
   applying a second metal layer having a thermal conductivity greater than 200 W/m-K and a coefficient of thermal expansion greater than 12 ppm/K on the second thin adhesion layer, wherein a CTE matching equation determines the thickness of the diamond layer, the first metal layer, and the second metal layer such that the CTE of the multilayered structure matches the CTE of a semiconductor, wherein the thickness of each of the first and second thin adhesion layers is less than 10% compared to the thickness of each of the first and second metal layers.

2. The method of claim 1, wherein the diamond layers are made electrically conductive by adding a p-type dopant to the diamond during the diamond growth step.

3. The method of claim 1, further comprising determining the value of the coefficient of thermal expansion at the surface of the first metal layer by using the ratio of the thicknesses, the Young's modulus and the coefficients of thermal expansion of the first metal layer, the second metal layer, and the diamond layer.

4. The method of claim 1, further comprising determining the thickness of the diamond layer by the following equation:

$$t_D = t_{M1} \times (E_D/E_{M1}) \times ((CTE_{M1} - CTE_C)/(CTE_C - CTE_D)) + t_{M2} \times (E_D/E_{M2}) \times ((CTE_{M2} - CTE_C)/(CTE_C - CTE_D)),$$ wherein as follows:

$t_D$ = thickness of the diamond layer
$t_{M1}$ = thickness of the first metal layer
$t_{M2}$ = thickness of the second metal layer
$E_D$ = Young's modulus of the diamond layer
$E_{M1}$ = Young's modulus of the first metal layer
$E_{M2}$ = Young's modulus of the second metal layer
$CTE_D$ = coefficient of thermal expansion of the diamond layer
$CTE_{M1}$ = coefficient of thermal expansion of the first metal layer
$CTE_{M2}$ = coefficient of thermal expansion of the second metal layer
$CTE_C$ = coefficient of thermal expansion for surface of the multilayered structure.

5. The method of claim 1, further comprising depositing additional layers of metal on the first metal layer to facilitate attachment of an electronic or optical component.

6. The method of claim 1, further comprising patterning the first metal layer and the first thin adhesion layer into electrically isolated regions.

7. A method of making a multilayered structure, comprising:
   growing a first diamond layer on a first substrate, wherein the bottom surface of the first diamond layer rests on the first substrate;
   growing a second diamond layer on a second substrate, wherein the bottom surface of the second diamond layer rests on the second substrate;
   brazing the top surface of the first diamond layer to the top surface of the second diamond layer wherein the brazing alloy adheres to the first and second diamond layers and has a thermal conductivity greater than 200 W/m-K and a coefficient of thermal expansion greater than 12 ppm/K;
   removing the first and second substrates;
   applying a first thin adhesion layer on the bottom surface of the first diamond layer;
   applying a first metal layer having a thermal conductivity greater than 200 W/m-K and a coefficient of thermal expansion greater than 12 ppm/K on the first thin adhesion layer;
   applying a second thin adhesion layer on the bottom surface of the second diamond layer; and applying a second metal layer having a thermal conductivity greater than 200 W/m-K and a coefficient of thermal expansion greater than 12 ppm/K on the second thin adhesion layer, wherein a CTE matching equation determines the thickness of the diamond layer, the first metal layer, and the second metal layer such that the CTE of the multilayered structure matches the CTE of a semiconductor, wherein the thickness of each of the first and second thin adhesion layers is less than 10% compared to the thickness of each of the first and second metal layers.

8. The method of claim 7, wherein the diamond layers are made electrically conductive by adding a p-type dopant to the diamond during the diamond growth step.

9. The method of claim 7, further comprising depositing additional layers of metal on the first metal layer to facilitate attachment of an electronic or optical component.

10. The method of claim 7, further comprising patterning the first metal layer and the first thin adhesion layer into electrically isolated regions.

11. The method of claim 7, wherein the brazing alloy is selected from a group of metals consisting of copper, silver, gold, tin, and/or indium.

12. The method of claim 7, further comprising determining the thickness of the diamond layer by the following equation:

$$t_D = t_{M1} \times (E_D/E_{M1}) \times ((CTE_{M1} - CTE_C)/(CTE_D - CTE_D)) + t_{M2} \times (E_D/E_{M2}) \times ((CTE_{M2} - CTE_C)/(CTE_C - CTE_D))$$ wherein as follows:

$t_D$ = thickness of each of the first and second diamond layers
$t_{M1}$ = thickness of the first outer metal layer
$t_{M2}$ = thickness of the second outer metal layer
$E_D$ = Young's modulus of the first diamond layer
$E_{M1}$ = Young's modulus of first metal layer
$E_{M2}$ = Young's modulus of the second metal layer
$CTE_D$ = coefficient of thermal expansion of the first diamond layer
$CTE_{M1}$ = coefficient of thermal expansion of first metal layer
$CTE_{M2}$ = coefficient of thermal expansion of second metal layer
$CTE_C$ = coefficient of thermal expansion for surface of multilayered structure.

13. The method of claim 7, wherein the brazing alloy includes a carbide forming metal.

14. The method of claim 13, wherein the carbide forming metal is selected from a group of metals consisting of titanium, chromium, tungsten, tantalum, vanadium, niobium, hafnium, zirconium or nickel.

15. A method of making a multilayered structure, comprising:
growing a first diamond layer on a first substrate, wherein the bottom surface of the first diamond layer rests on the first substrate;
applying a first thin adhesion layer on the top surface of the first diamond layer;
applying a first metal layer having a thermal conductivity greater than 200 W/m-K and a coefficient of thermal expansion greater than 12 ppm/K on the first thin adhesion layer;
growing a second diamond layer on a second substrate, wherein the bottom surface of the second diamond layer rests on the second substrate;
applying a second thin adhesion layer on the top surface of the second diamond layer;
applying a second metal layer having a thermal conductivity greater than 200 W/m-K and a coefficient of thermal expansion greater than 12 ppm/K on the second thin adhesion layer;
brazing or soldering the top surface of the first metal layer to the top surface of the second metal layer;
removing the first and second substrates;
applying a third thin adhesion layer on the bottom surface of the first diamond layer;
applying a third metal layer having a thermal conductivity greater than 200 W/m-K and a coefficient of thermal expansion greater than 12 ppm/K on the third thin adhesion layer;
applying a fourth thin adhesion layer on the bottom surface of the second diamond layer; and
applying a fourth metal layer having a thermal conductivity greater than 200 W/m-K and a coefficient of thermal expansion greater than 12 ppm/K on the fourth thin adhesion layer, wherein a CTE matching equation determines the thickness of the diamond layer, the first metal layer, the second metal layer, the third metal layer, and the fourth metal layer such that the CTE of the multilayered structure matches the CTE of a semiconductor, wherein the thickness of each of the first thin adhesion layer, the second thin adhesion layer, the third thin adhesion layer, and the fourth thin adhesion layer is less than 10% compared to the thickness of each of the first metal layer, the second metal layer, the third metal layer, and the fourth metal layer.

16. The method of claim 15, wherein the diamond layers are made electrically conductive by adding a p-type dopant to the diamond during the diamond growth step.

17. The method of claim 15, further comprising depositing additional layers of metal on the first metal layer to facilitate attachment of an electronic or optical component.

18. The method of claim 15, further comprising patterning the first metal layer and the first thin adhesion layer into electrically isolated regions.

19. The method of claim 15, wherein the brazing alloy is selected from a group of metals consisting of copper, silver, gold, tin, and/or indium.

20. The method of claim 15, wherein the solder alloy is selected from a group of metals consisting of silver, gold, tin, indium, germanium, lead, antimony, palladium and/or silicon.

21. The method of claim 15, further comprising determining the thickness of the diamond layer by the following equation:

$$t_D = t_{M1} \times (E_D/E_{M1}) \times ((CTE_{M1} - CTE_C)/(CTE_C - CTE_D)) + t_{M2} \times (E_D/E_{M2}) \times ((CTE_{M2} - CTE_C)/(CTE_C - CTE_D))$$ wherein as follows:

$t_D$ = thickness of each of the first and second diamond layers
$t_{M1}$ = thickness of the first outer metal layer
$t_{M2}$ = thickness of the second outer metal layer
$E_D$ = Young's modulus of the first diamond layer
$E_{M1}$ = Young's modulus of first metal layer
$E_{M2}$ = Young's modulus of the second metal layer
$CTE_D$ = coefficient of thermal expansion of the first diamond layer
$CTE_{M1}$ = coefficient of thermal expansion of first metal layer
$CTE_{M2}$ = coefficient of thermal expansion of second metal layer
$CTE_C$ = coefficient of thermal expansion for surface of multilayered structure.

* * * * *